United States Patent
Severance et al.

(10) Patent No.: US 7,589,284 B2
(45) Date of Patent: Sep. 15, 2009

(54) COMPOSITE POLYMERIC MATERIAL FOR EMI SHIELDING

(75) Inventors: Christopher L. Severance, Derry, NH (US); Douglas Nobbs, Dover, NH (US); John D. Reynolds, Lowell, MA (US)

(73) Assignee: Parker Hannifin Corporation, Cleveland, OH (US)

( * ) Notice: Subject to any disclaimer, the term of this patent is extended or adjusted under 35 U.S.C. 154(b) by 0 days.

(21) Appl. No.: 11/519,345

(22) Filed: Sep. 12, 2006

(65) Prior Publication Data

US 2007/0056769 A1    Mar. 15, 2007

Related U.S. Application Data

(60) Provisional application No. 60/716,312, filed on Sep. 12, 2005.

(51) Int. Cl.
*H05K 9/00* (2006.01)

(52) U.S. Cl. .................. 174/358; 174/388; 428/323; 428/328

(58) Field of Classification Search ............... 174/388, 174/390, 35; 361/816, 818; 428/323, 328
See application file for complete search history.

(56) References Cited

U.S. PATENT DOCUMENTS

| | | | | |
|---|---|---|---|---|
| 5,498,372 | A  * | 3/1996 | Hedges | 252/511 |
| 6,902,688 | B2 * | 6/2005 | Narayan et al. | 252/512 |
| 2002/0149004 | A1* | 10/2002 | Hayward et al. | 252/500 |
| 2005/0165169 | A1* | 7/2005 | Levey et al. | 525/192 |
| 2007/0034839 | A1* | 2/2007 | Cosman et al. | 252/500 |

* cited by examiner

*Primary Examiner*—Hung V Ngo
(74) *Attorney, Agent, or Firm*—Rissman Hendricks & Oliverio LLP

(57) ABSTRACT

An EMI shielding material is provided for making EMI shielding gaskets, coating and other articles. The EMI shielding material includes a non-conductive polymer, an inherently conductive polymer and a conductive metal powder. These components are intimately combined to prepare EMI shielding materials having superior electrical and mechanical performance when used in applications such as housings for electronic components.

14 Claims, No Drawings

COMPOSITE POLYMERIC MATERIAL FOR EMI SHIELDING

CROSS-REFERENCE TO RELATED APPLICATIONS

This application claims the benefit of priority from U.S. Provisional Application No. 60/716,312 filed on Sep. 12, 2005, the specification of which is incorporated herein by reference.

BACKGROUND OF THE INVENTION

The present invention relates to electromagnetic interference (EMI) shielding, and more specifically, to an improved composite polymeric material for providing enhanced EMI shielding.

An electromagnetic signal is propagated with an electrical field component and a magnetic field component. The electromagnetic signal can interfere with the propagating signal in an electronic circuit assembly resulting in electromagnetic interference. Electromagnetic interference is the generation of undesired electrical signals in electronic system circuitry because of the unintentional coupling of impinging electromagnetic field energy.

Enormous progress in nanotechnology has made electronic systems smaller and has increased the density of electrical components within an instrument. The operating frequency of signals in these systems is also increasing by the day. The increasing operating frequency in these electrical systems results in an elevated level of high frequency electromagnetic interference (EMI). The prevalence of high frequency systems and portable electronic circuitries are creating a very complex spectral environment for the operation of sensitive electrical/electronic systems. Accordingly, it is often advantageous to shield an electrical/electronic circuit assembly to prevent it from emitting EMI, or to shield an electrical/electronic circuit assembly from EMI emitted elsewhere.

The electromagnetic interference shielding of electronic component assemblies has taken many forms. Sensitive or radiating devices may be covered with a lid and/or an enclosure which is connected to ground potential in the process of securing the cover in place. Shielding close to the source, where the field intensity is the highest, requires greater shield efficiency to contain the field.

It is common to shield the sensitive, electromagnetic interference receiving component or even the entire circuit board using conductive composites. Conducting polymer materials, such as a screen-printable copper filled epoxy paste, are generally used to form a shield.

Conductive composites, in the form of coatings, strips or molded materials, can be prepared by the addition of highly conductive metal fillers or powders to non-conductive polymer substrates. There is frequently a tradeoff of electrical performance and physical characteristics desired in a selected application. Increasing the conductivity of the composite, for example by adding conductive metal powder, leads to a reduction in the physical performance of the composite. On the other hand, if the amount of conductive metal powder added to the composite is reduced, the physical performance is enhanced but the electrical performance deteriorates.

Typical coating compositions include electrically-conductive paints, conductively-filled molded elastomeric layers, or flame-sprayed or other deposited metal layers. A conductive gasket may be used to provide electrical continuity between the coating-layers applied to the various mating housing parts.

Various enclosed systems are known to a person of ordinary skill in the art. The enclosed systems are powered by external alternating current and are shielded from electromagnetic interference by the incorporation of internal shields which are connected to a ground potential. A metal cabinet housing which encloses the system may be designed to function as a shield. However, metal housings are often expensive, heavy, and difficult to make in complex shapes. The inside of a molded plastic housing may be coated with a thin metal film through vacuum metallization, but this process often yields a brittle and less flexible shield. Another method is to coat the enclosure with a thin film of a conductor using a metal-filled paint. A metal-filled plastic may also be used to form the housing.

Existing shield assemblies provide limited reuse capabilities and are limited to single compartments. The materials such as paint or plate injection molds or thermoformed materials have not been successfully deployed due to low shielding capabilities. A form-in place gasket has been tried in the existing assemblies, but not in conjunction with a thermally sprayed coating and an electrically conductive plastic.

It is therefore desirable to provide a polymeric material which, when molded with appropriate conductive fillers and shaped into an EMI shielding substrate or component, exhibits improved EMI shielding properties.

Accordingly, it is an object of the invention to provide an EMI shielding material that has improved shielding effectiveness.

It is another object of the invention to provide an EMI shielding material that has improved conductivity.

It is another object of the invention to provide an EMI shielding material that has high tensile strength and flexural strength.

SUMMARY OF THE INVENTION

To achieve the aforementioned objects and to overcome the drawbacks of the prior art, the present invention provides an improved EMI shielding material. The EMI shielding material of the present invention comprises a non-conductive polymer, an inherently conductive polymer, and an electrically conductive filler. The polymers are combined to form an intimate blend without forming a macro-phase of either polymer. The EMI shielding material can be used to form useful articles, such as flexible gaskets, and coatings for housings containing a variety of electronic components.

In one embodiment, the non-conductive polymer is an elastomeric, thermoplastic polymer comprising a silicone, urethane or flexible epoxy, which is formed into a gasket. The gasket can be advantageously formed-in-place on the housing desired to be protected from emitting or receiving electromagnetic energy.

In another embodiment, the non-conductive polymer can also be a thermoplastic such as polystyrene, PC/ABS alloys, PBT, nylon, PC, ABS, and mixtures thereof.

In one embodiment, the inherently conductive polymer is polyaniline. In alternate embodiments, the inherently conductive polymer can be polypyrrole, polythiophene, polyethylenedioxythiophene, or poly(p-phenylene vinylene).

The electrically conductive filler can be a powder or fiber, or some combination of the two. Preferably, the powder is nickel plated carbon powder, carbon powder, silver powder, copper powder, silver/copper powder, silver/aluminum powder, silver plated glass spheres, and nickel powder.

In one particularly advantageous method of preparing the EMI shielding material, conductive fibers, such as nickel plated carbon fibers, are coated with a blend of inherently conductive polymers and non-conductive polymers. The coated fibers are extruded in a wire coating process as a continuous coated fiber, cut into pellets, and injection molded to form useful articles.

DETAILED DESCRIPTION OF THE INVENTION

The present invention provides an EMI shielding material having superior electrical and mechanical properties.

More particularly, according to the present invention, a non-conductive polymer is combined or blended with an inherently conductive polymer and an electrically conductive filler in suitable proportions to form an intimate mixture. The polymers are mixed in sufficient proportion, and the blending is sufficiently thorough, so that a macro-phase of either polymer is not readily discernible in the final admixture.

By a "non-conductive polymer" is generally meant a standard polymer having a specific conductivity about a factor of $10^4$ lower than the specific conductivity of a conductive polymer. Suitable non-conductive polymers can be thermoplastics or thermosets, although thermoplastics are generally preferred. Such polymer are selected on the basis of one or more of the following parameters: operating temperature, hardness, chemical compatibility, resiliency, compliancy, compression-deflection, compression set, flexibility, ability to recover after deformation, modulus, tensile strength, elongation, force defection, flammability, compatibility with the inherently conductive polymer of the invention, or other chemical or physical properties.

Depending upon the particular application, suitable non conductive polymers may include, particularly, polyurethanes, silicones, fluorosilicones, polycarbonates, ethylene vinyl acetates (EVA), acrylonitrile-butadiene-styrenes (ABS), polysulfones, acrylics, polyvinyl chlorides (PVC), polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes (SIS), styrene-butadiene-styrenes (SBS), ethylene-propylenes (EPR), ethylene-propylene-diene monomers (EPDM), nitrile-butadienes (NBR), and styrene-butadienes (SBR), and copolymers and blends thereof. Any of the forgoing materials may be used unfoamed or, if required by the application, blown or otherwise chemically or physically processed into open or closed cell foams.

Inherently conductive polymers or "ICP's" are polymers that have electrical conductivity properties similar to inorganic semiconductors. By an "inherently conductive polymer" is generally meant a polymer having inherent conductivity of more than about 1 S/cm. Typical examples of such inherently conductive polymers are polyaniline, polypyrrole, polythiophene, polyethylenedioxythiophene, poly(p-phenylene vinylene), polydiacetylene, polyacetylene, polythiophene polyphenylene-sulphide (PPS), polyperinaphthalene (PPN), polyphthalocyanine (PPhc) etc., and their derivatives and copolymers.

The inherently conductive polymer and non-conductive polymer can be blended using standard techniques, such as melt-blending or dispersing the filler particles during polymerization of the matrix polymer (sol-gel processes), to form an intimate blend of the components. Such a blend will generally be a continuous or matrix phase wherein the macrophase is absent.

The electrically conductive filler includes, but is not limited to, nickel plated carbon fiber, carbon fiber, carbon powder, silver powder, copper powder, Ag/Cu powder, Ag/Al powder, Ag plated glass spheres, nickel powder, or any combination of these fillers. The electrically conductive filler can advantageously be in the form of powders, fibers, both coated and uncoated, or both. The filler generally is included within the polymer matrix in a proportion sufficient to provide the level of electrical conductivity which is desired for the intended application.

The thermoplastic polymer can be dispersed either with an electrically conductive fiber or an electrically conductive powder for providing the desired shielding properties. In an embodiment of the present invention, the electrically conductive filler can be added in amounts of between about 1% and about 50% by weight depending on the overall specification of the final product. The weight ratio can be varied to obtain desired and specific properties. It should be appreciated that the identification and selection of the proper combination of the material properties is important in achieving the desired performance properties. The overall structure avoids risks of electrical shock and completely envelopes the regions to provide a desired shielding effectiveness. Examples of suitable thermoplastic polymers include, but are not limited to, PC/ABS alloys, PBT, nylon, PC, ABS, and mixtures thereof. Examples of suitable electrically conductive fillers include, but are not limited to, nickel plated carbon fiber, carbon fiber, carbon powder, silver powder, copper powder, Ag/Cu powder, Ag/Al powder, Ag plated glass spheres, and nickel powder.

One embodiment of the EMI shielding material provided by the present invention comprises conductive fibers, such as nickel plated carbon fibers, coated with a blend of inherently conductive polymers and non-conductive polymers. The coated fibers are extruded in a wire coating process as a continuous coated fiber, cut into pellets, and injection molded into useful articles.

The electrical conductivity of the resulting EMI material include components from the conductivity of both the ICP and the filler material, and the resulting combined conductivity is greater than that of materials available in existing EMI shielding products.

The EMI shielding material provided by the present invention finds applications in a whole range of industries including aerospace, defense electronics, medical electronics, automotive electronic and any other industry utilizing sensitive equipments. Some examples of devices where the shielding material may be used include mobile phones, medical equipments, computers, modems, integrated circuits, printed circuit boards, television sets and stereo systems. The material can also be used for coating windows, vents, fabrics, and walls to shield them from EMI. The EMI shielding material may be used either as a flexible shielding gasket or as a coating.

The description above, and that which follows, is only meant to describe one particularly advantageous embodiment of the present invention and as such is only meant to illustrate, not limit it.

Example 1

An EMI shielding composition was prepared by coating a nickel plated carbon fiber wire with an intimate blend of polystyrene and polyaniline. The nickel plated carbon fiber wire was extruded in a cross head wire extruder and coated with the polymer blend. The composite was chopped into pellets, and the pellets were molded into test articles in an injection molding machine. Surface resistance and though resistance were measured for the test articles. The results are shown in Table 1.

TABLE 1

|  | 30% Ni/C Fiber filled polystyrene/ polyaniline | 10% Ni/C Fiber filled polystyrene/ polyaniline | 30% Ni/C Fibers in PC/ABS | 10% Ni/C Fibers in PC/ABS |
|---|---|---|---|---|
| Surface Resistance (mOhms) | 45 | 800 | 150 | 4000 |
| Through Resistance (mOhms) | 4 | 80 | 25 | 500 |

Table 2 shows the comparison of various properties of the EMI shielding material provided by the present invention with the existing materials.

TABLE 2

| Material/ Prop. | Royalstat HDPE R64 (SPARTECH) | Stat-Tech AS-1000 AS (PolyOne) | Emi-X* OC-1008 LEX | RTP 461 HI FR |
|---|---|---|---|---|
| Specific Gravity (gm/cm3) | 1.06 | 1.10 | 1.49 | 1.25 |
| Tensile Strength (psi) | 4,400 | 5,000 | 26,231 | 3,700 |
| Flexural Modulus (psi) | 180,000 | 257,000 | 3,945,000 | 310,000 |
| Flexural Strength (psi) | 5,500 | 7,400 | 38,000 | 6,600 |
| Heat deflection Temperature (° F.) | 180 | 188 | — | 190 |
| Surface Resistivity (ohms/square) | $<10^5$ | $10^{10}$ to $10^{12}$ | 10 to $10^3$ | $<10^4$ |

Various other embodiments are possible and are within the spirit and scope of the invention and the aforementioned embodiments. For instance, the material can be deployed to provide thermal management or Electromagnetic Interference (EMI)/Radio frequency Interference (RFI) shielding for multiple circuitries. The particular embodiments described herein are meant to be for explanatory purposes only, and are not intended to restrict the invention in any manner. EMI shielding articles of the invention may be made from various kinds of materials available in the field and known to a person skilled in the art. The invention intends to cover all the equivalent embodiments and is limited only by the appended claims.

What is claimed is:

1. An EMI shielding material comprising:
    an intimate admixture of a non-conductive elastomer polymer selected from the group consisting of silicone, urethane, flexible epoxy, polystyrene, PC, ABS, PC/ABS alloys, PBT, nylon, and mixtures thereof, and an inherently conductive polymer; and
    an electrically conductive filler;
    wherein said material can be shaped in a desired form to provide EMI shielding characteristics.

2. The EMI shielding material as claimed in claim 1 formed into an EMI shielding article.

3. The EMI shielding material as claimed in claim 1 wherein the EMI shielding material is a flexible EMI shielding gasket.

4. A housing for electronic components comprising the EMI shielding gasket as claimed in claim 3.

5. The EMI shielding material as claimed in claim 1 wherein the EMI shielding material is a coating.

6. The EMI shielding material of claim 5 used for coating an enclosure housing an electronic circuit.

7. The EMI shielding material as claimed in claim 1 wherein the inherently conductive polymer is polyaniline.

8. The EMI shielding material as claimed in claim 1 wherein the non-conductive polymer is polystyrene.

9. The EMI shielding material as claimed in claim 1 wherein the non-conductive polymer and inherently conductive polymer are combined in proportions and under conditions to present the formation of a macro-phase of either polymer.

10. The EMI shielding material as claimed in claim 1 wherein the electrically conductive filler is a powder or fiber, or combination thereof.

11. The EMI shielding material as claimed in claim 10 wherein the electrically conductive filler is selected from the group consisting of nickel plated carbon, carbon, silver powder, copper powder, silver/copper powder, silver/aluminum powder, silver plated glass spheres, and nickel powder.

12. The EMI shielding material as claimed in claim 11 wherein the conductive filler is selected from the group consisting of silver powder, copper powder, silver/copper powder, silver/aluminum powder, silver plated glass spheres, nickel powder and nickel plated carbon fiber.

13. An EMI shielding material comprising:
    an intimate admixture of a non-conductive elastomer polymer selected from the group consisting of silicone, urethane, flexible epoxy, polystyrene, PC, ABS, PC/ABS alloys, PBT, nylon, and mixtures thereof, and an inherently conductive polymer; and
    an electrically conductive filler dispersed in the admixture forming a blend, the filler constituting between 1% and about 50% by weight of the blend;

wherein the EMI shielding material is formed into a shielding gasket or coating.

14. An EMI shielding material comprising:

an intimate admixture of a non-conductive elastomer polymer selected from the group consisting of silicone, urethane, flexible epoxy, polystyrene, PC, ABS, PC/ABS alloys, PBT, nylon, and mixtures thereof, and an inherently conductive polyaniline polymer; and an electrically conductive filler;

wherein said material can be shaped in a desired form to provide EMI shielding characteristics.

* * * * *